US006304441B1

(12) United States Patent
Han

(10) Patent No.: US 6,304,441 B1
(45) Date of Patent: Oct. 16, 2001

(54) RADIATION APPARATUS AND RADIATION METHOD FOR INTEGRATED CIRCUIT SEMICONDUCTOR DEVICE AND FOR PORTABLE COMPUTER

(75) Inventor: Duk-Ho Han, Suwon (KR)

(73) Assignee: Sansung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/377,860

(22) Filed: Aug. 20, 1999

(30) Foreign Application Priority Data

Aug. 20, 1998 (KR) .................................................. 98-33776

(51) Int. Cl.[7] ................................. G06F 1/16; H05K 7/20
(52) U.S. Cl. ........................ 361/687; 361/697; 361/699; 165/80.3; 174/15.2; 62/259.2
(58) Field of Search ..................................... 361/687, 683, 361/681, 682, 686, 695, 699, 700, 705; 165/122–126, 80.3, 80.4, 185, 104.33; 62/259.2; 174/15.2

(56) References Cited

U.S. PATENT DOCUMENTS

| 4,027,206 | 5/1977 | Lee . |
| 4,602,314 | 7/1986 | Broadbent . |
| 4,621,304 | 11/1986 | Oogaki et al. . |
| 5,014,777 | 5/1991 | Sano . |
| 5,024,264 | * 6/1991 | Natori et al. ........................ 165/80.4 |
| 5,155,579 | 10/1992 | Au Yeung . |
| 5,339,214 | * 8/1994 | Nelson ................................ 361/695 |
| 5,399,906 | 3/1995 | Komuro . |
| 5,482,898 | 1/1996 | Marrs . |
| 5,485,037 | 1/1996 | Marrs . |
| 5,528,456 | 6/1996 | Takahashi . |
| 5,548,482 | 8/1996 | Hatauchi et al. . |
| 5,598,320 | * 1/1997 | Toedtman et al. .................... 361/687 |
| 5,646,820 | * 7/1997 | Honda et al. ........................ 361/683 |
| 5,689,404 | 11/1997 | Katsui . |
| 5,731,952 | * 3/1998 | Ohgami et al. ...................... 361/687 |
| 5,814,536 | 9/1998 | Rostoker et al. . |
| 5,869,891 | 2/1999 | Rostoker et al. . |
| 5,986,882 | * 11/1999 | Ekrot et al. ......................... 361/687 |
| 6,043,977 | * 3/2000 | Nakajima ............................ 361/687 |

FOREIGN PATENT DOCUMENTS

| 4111333-A1 | * 10/1992 | (DE) ................................... 361/687 |
| 4235821-A1 | * 7/1993 | (DE) ................................... 361/687 |

* cited by examiner

*Primary Examiner*—Leo P. Picard
*Assistant Examiner*—Lisa Lea-Edmonds
(74) *Attorney, Agent, or Firm*—Robert E. Bushnell, Esq.

(57) ABSTRACT

A radiation apparatus for an integrated circuit semiconductor device and for a portable computer are provided. The radiation apparatus for an integrated circuit semiconductor device mounted on a circuit board of an electronic system includes a radiation member and a fan. The radiation member radiates heat generated by the integrated circuit semiconductor device, the radiation member being coupled to the integrated circuit semiconductor device. The fan emits the heat, transferred from the integrated circuit semiconductor device through the radiation member, out of the circuit board of the electronic system, the fan being arranged in parallel with the same direction as a horizontal direction of the integrated circuit semiconductor device. The radiation member has a radiation plate, a heat block and an assembly of radiation fins. The radiation plate has an upper plane and a bottom plane and one end part of the radiation plate is located over the fan. The heat block is in contact with an upper plane of the integrated circuit semiconductor device and coupled to the bottom plane of the radiation plate, transmitting the heat into the radiation plate, and the assembly of radiation fins is located between the fan and the radiation plate and coupled to the radiation plate, with the fan having an air inlet on its upper plane. Therefore, it is possible to effectively radiate and remove heat generated by an integrated circuit semiconductor device mounted upon a circuit board of an electronic system by using heat convection and conduction.

34 Claims, 10 Drawing Sheets

RADIATION APPARATUS AND RADIATION METHOD FOR INTEGRATED CIRCUIT SEMICONDUCTOR DEVICE AND FOR PORTABLE COMPUTER

CLAIM OF PRIORITY

This application makes reference to, incorporates the same herein, and claims all benefits accruing under 35 U.S.C. §§119 from an application for A RADIATION APPARATUS FOR SEMICONDUCTOR IC APPARATUS AND PORTABLE COMPUTER WITH THE SAME earlier filed in the Korean Industrial Property Office on Aug. 20, 1998 and there duly assigned Serial No. 98-33776.

FIELD OF THE INVENTION

The present invention relates to a radiation apparatus for an integrated circuit semiconductor device and for a portable computer which can effectively radiate heat generated at the integrated circuit semiconductor device.

BACKGROUND OF THE INVENTION

Typically computer systems require a radiation apparatus for an integrated circuit semiconductor device. Such a radiation apparatus is used to radiate heat generated by a central processing unit (CPU) and is typically composed of a heat sink type.

For example, a heat sink is a block or plate which is made of a material that has an excellent heat conduction, such as aluminum or an aluminum alloy. Such a block or plate has fins as an assembly on its upper plane. Such a block or plate is for heat conduction and is attached, in contact with and connected to an upper surface of the central processing unit (CPU). When heat is generated while the central processing unit (CPU) is operated, generated heat is conducted to a heat sink and then removed through convection. However, the above-mentioned heat sink has some drawbacks, such as low heat removing efficiency.

Various attempts have been made to increase heat removing efficiency. For example, a fan has been added to the heat sink. Such a fan can convect generated heat through fins. Accordingly, the heat removing efficiency can be increased due to compulsory heat convection by the fan. However, there are also some problems with the fan, such as limited space for a fan to be established in the heat sink. Such problem associated with limited space is not compatible with a recent trend toward small-sized portable computers, such as notebook computers. In this regard, a notebook computer has little room for a fan.

Accordingly, there is strong need for a radiation apparatus which can efficiently radiate heat generated by the integrated circuit semiconductor device of a small-sized electronic system. Particularly, a radiation apparatus for a portable computer is needed which radiates more heat due to its larger central processing unit (CPU) volume in a slim electronic system.

SUMMARY OF THE INVENTION

It is an object among other objects of the present invention to provide a radiation apparatus for an integrated circuit semiconductor device which can effectively radiate heat generated by the integrated circuit semiconductor device mounted upon a circuit board of an electronic system.

It is another object of the present invention to provide a portable computer which can effectively radiate heat generated by an integrated circuit semiconductor device in a limited interior of a housing of a portable computer.

In order to attain the above objects and other objects of the present invention, according to an aspect of the present invention, there is provided a radiation apparatus for an integrated circuit semiconductor device mounted on a circuit board of an electronic system, the radiation apparatus includes a radiation member and a fan. The radiation member radiates heat generated by the integrated circuit semiconductor device, the radiation member being coupled to the integrated circuit semiconductor device. The fan exhausts or removes the heat, transferred from the integrated circuit semiconductor device through the radiation member, from the circuit board of the electronic system, the fan being arranged in parallel, spaced relation to the integrated circuit semiconductor device. The radiation member includes a radiation plate, a heat block and an assembly of first radiation fins. The radiation plate has an upper plane or first surface and a bottom plane or second surface and one end part thereof is located in opposing relation to the fan, and the heat block is in contact with an upper plane or first surface of the integrated circuit semiconductor device and coupled to the bottom plane or second surface of the radiation plate, transmitting the heat into the radiation plate, and the assembly of first radiation fins is located between the fan and the radiation plate and coupled to the radiation plate, and the fan having an air inlet on its upper plane or first surface.

The fan has an air outlet on one lateral plane or second surface to exhaust air introduced from the air inlet of the fan, and then air in the interior of the electronic system is exhausted out of the exterior of the electronic system via an air flow path between the air inlet on the upper plane or first surface of the fan and the air outlet on the one lateral plane or second surface of the fan.

The radiation member further includes an assembly of second radiation fins coupled to the upper plane or the first surface of one end part of the radiation plate to which the assembly of first radiation fins is coupled, and at least one heat pipe is located on the radiation plate and transmitting the heat into the radiation plate on which the fan is located. The at least one heat pipe is coupled to the bottom plane or the second surface of the radiation plate such that the at least one heat pipe is located on a lateral plane or first surface of the heat block.

According to another aspect of the present invention, there is provided a portable computer having a heat radiation apparatus. The portable computer includes a housing having a bottom plane or first surface, an upper plane or second surface and a plurality of lateral planes or third surfaces which define an interior space of the housing, a circuit board established on the bottom plane or the first surface of the housing, a receiving part located on the upper plane or the second surface of the housing and defining an opening or aperture passing into the interior space of the housing, a removable keyboard assembly having a plate and being established on the receiving part of the portable computer, an integrated circuit semiconductor device located on the circuit board through the opening or aperture of the receiving part of the portable computer, a radiation member for radiating heat generated by the integrated circuit semiconductor device, the radiation member being coupled to and being in contact with the upper plane or the first surface of the integrated circuit semiconductor device through the opening or aperture of the receiving part and being in contact with the plate of the removable keyboard assembly, and a fan exhausting air from the interior of the housing of the portable computer to an exterior of the housing of the portable computer, the fan being located under the radiation member and positioned near or on the bottom plane or first surface of the housing.

The radiation member includes a radiation plate having an upper plane or first surface and a bottom plane or second surface, and one end part of the radiation plate being located in opposing relation to the fan, and the upper plane or the first surface of the radiation plate being in contact with the plate of the keyboard through the opening or aperture of the receiving part, a heat block being in contact with the upper plane or the first surface of the integrated circuit semiconductor device and being coupled to the bottom plane or second surface of the radiation plate, the heat block transmitting the heat into the radiation plate, an assembly of first radiating fins being coupled to the bottom plane or second surface of the radiation plate on a part of the radiation plate positioned over the fan, an assembly of second radiating fins being coupled to an upper plane or first surface of one end part of the radiation plate to which the assembly of first radiation fins is coupled, and at least one heat pipe being coupled to the bottom plane or second surface of the radiation plate such that one end part of the at least one heat pipe is in contact with the first radiation fins, the at least one heat pipe directly transmitting the heat into the assembly of first radiation fins.

The portable computer further includes a first air vent located on a lateral plane or a third surface of the housing near the integrated circuit semiconductor device, a second air vent located on a lateral plane or a third surface of the housing near the fan, and a third air vent located on another lateral plane or another third surface of the housing relative to the second air vent, wherein exterior air is introduced through the inlets of the first air vent and the third air vent into the interior of the housing of the portable computer by driving the fan and the introduced air is introduced into the inlet of the fan by passing in contact with the integrated circuit semiconductor device and the radiation member with the introduced air being exhausted by the fan through the outlet of fan to the second air vent to thereby form an air flow path for the introduced air to the exterior of the housing of the portable computer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
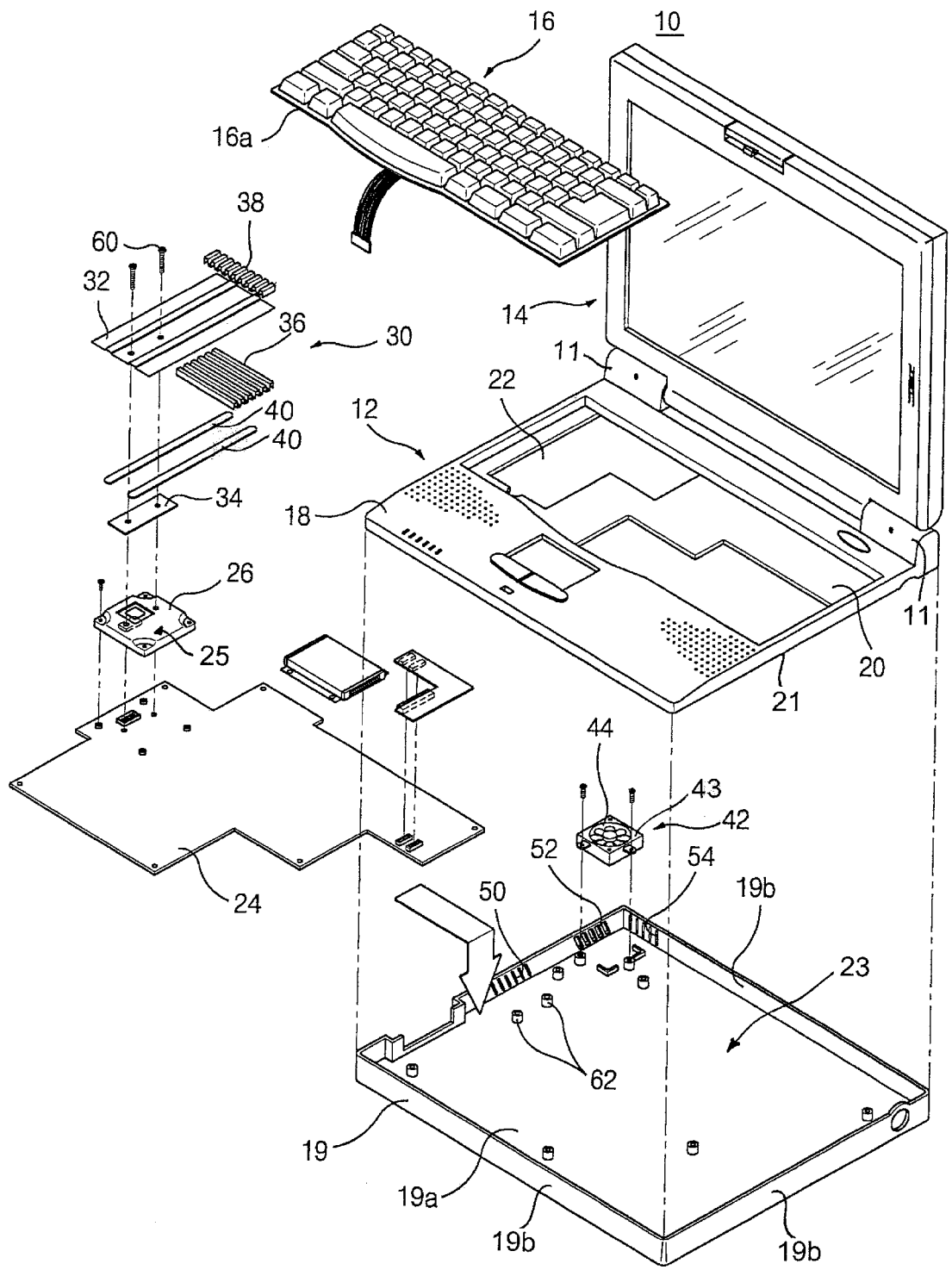
FIG. 1 is a perspective exploded view showing a portable computer with a radiation apparatus for an integrated circuit semiconductor device according to an embodiment of the invention.

Now, embodiments of the present invention will be described more fully with reference to accompanying drawings. In the drawings, the same reference numerals denote the same elements.

FIG. 1 is a perspective exploded view showing a portable computer with a radiation apparatus for an integrated circuit semiconductor device according to an embodiment of the present invention.

Referring now to FIG. 1, there is illustrated a typical portable computer 10 having a radiation apparatus of the present invention. The typical portable computer 10 can be another type of portable computer, such as a lap-top computer or a palm-top computer, for example.

In general, referring to FIG. 1 the portable computer 10 includes a main body 12 and a display panel 14. The main body 12 is hingedly coupled to the display panel 14, with the display panel 14 being located on the main body 12 by the hinge coupling 11. A housing or main body 12 of the portable computer 10 includes a top housing 18 and a bottom housing 19. The bottom housing 19 includes a lower or bottom plane or first surface 19a and a plurality of lateral planes or third surfaces 19b. The top housing 18 is coupled to the bottom housing 19. An interior 23 of the main body or housing 12 is made by the coupling of the top housing 18 to the bottom housing 19 providing an upper plane or second surface 21 of the housing or main body 12. A receiving part 20 is made on the top housing 18 in the upper plane or second surface 21. A keyboard assembly 16 is mounted upon the receiving part 20. An opening or aperture 22 passing through to the interior 23 of the housing 12 is made in the receiving part 20. The shape and size of the opening or aperture 22 can be different in accordance with the type of product. Although described later, in the portable computer 10, a central processing unit (CPU) 26 (FIG. 3) is mounted upon the mother board 24 through the opening or aperture 22 and a radiation member 30 of a radiation apparatus for an integrated circuit semiconductor device, such as central processing unit (CPU) 26, is removable, such as at the central processing unit (CPU) 26.

In general, the mother board 24 and a plurality of electronic devices are mounted in the interior 23 of the housing or main body 12. The mother board 24 and a plurality of the electronic devices include a plurality of integrated circuit semiconductor devices, such as the central processing unit (CPU) 26, for example. Further, a power supply device and a disk drive assembly or assemblies can also be mounted in the interior 23 of the housing or main body 12.

Figure 2A:
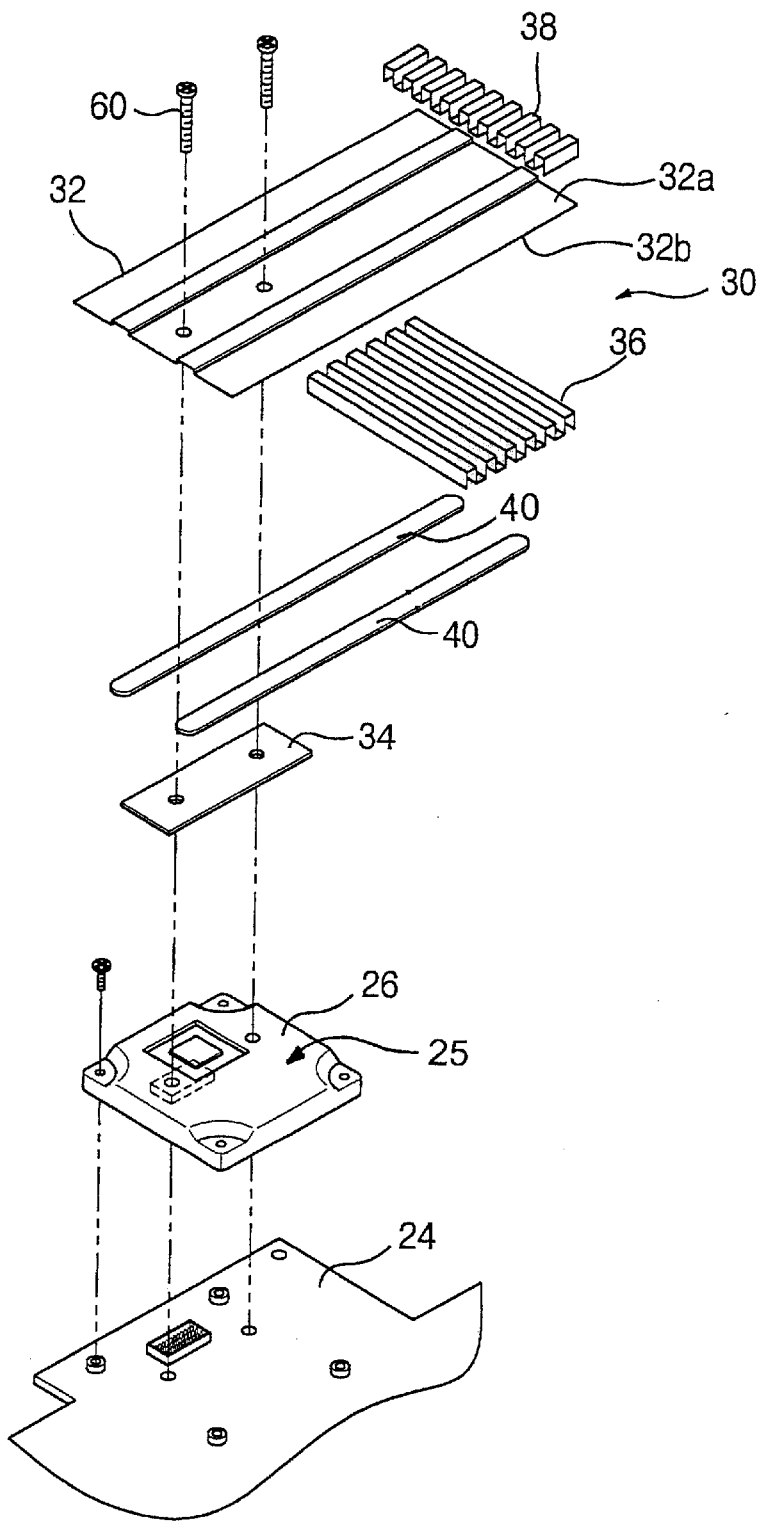
FIGS. 2A and 2B are diagrams for depicting radiation members of a radiation member shown in FIG. 1 according to the present invention.
Figure 2B:
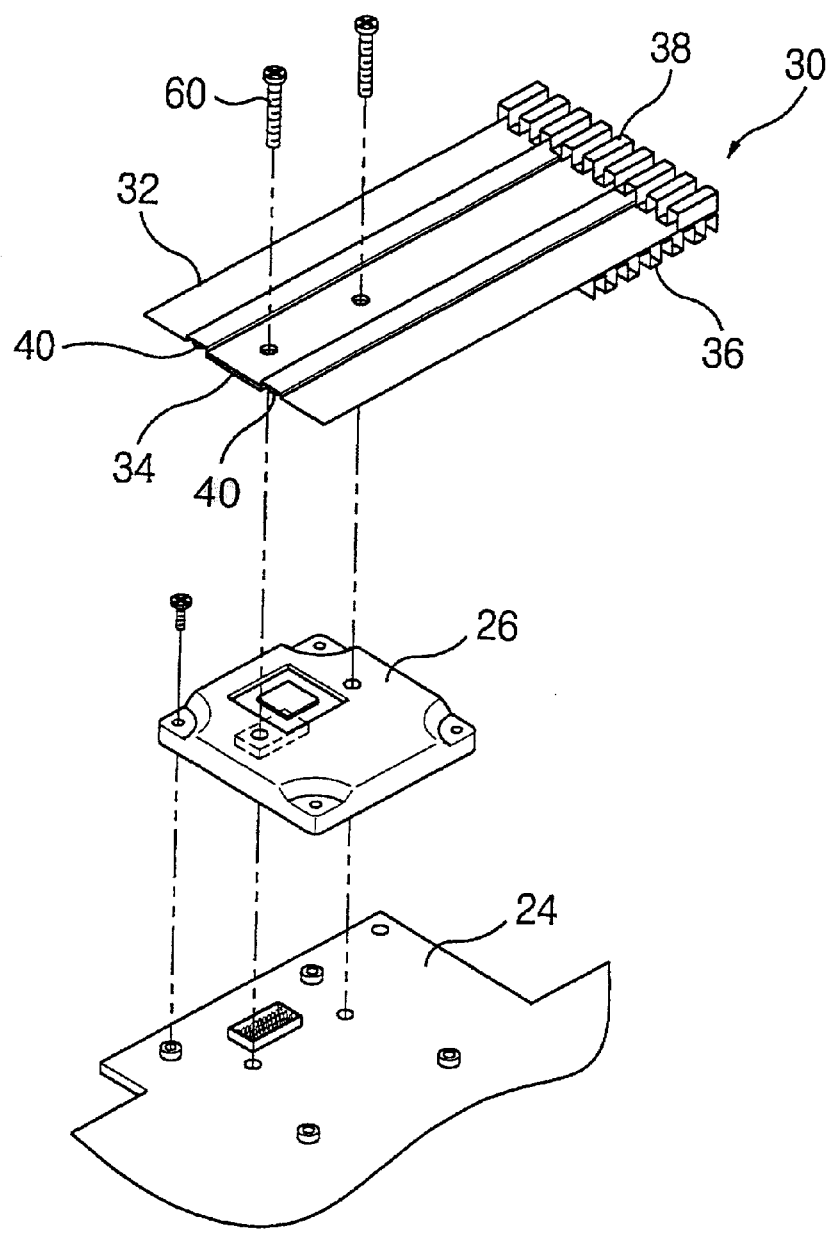
Figure 3:
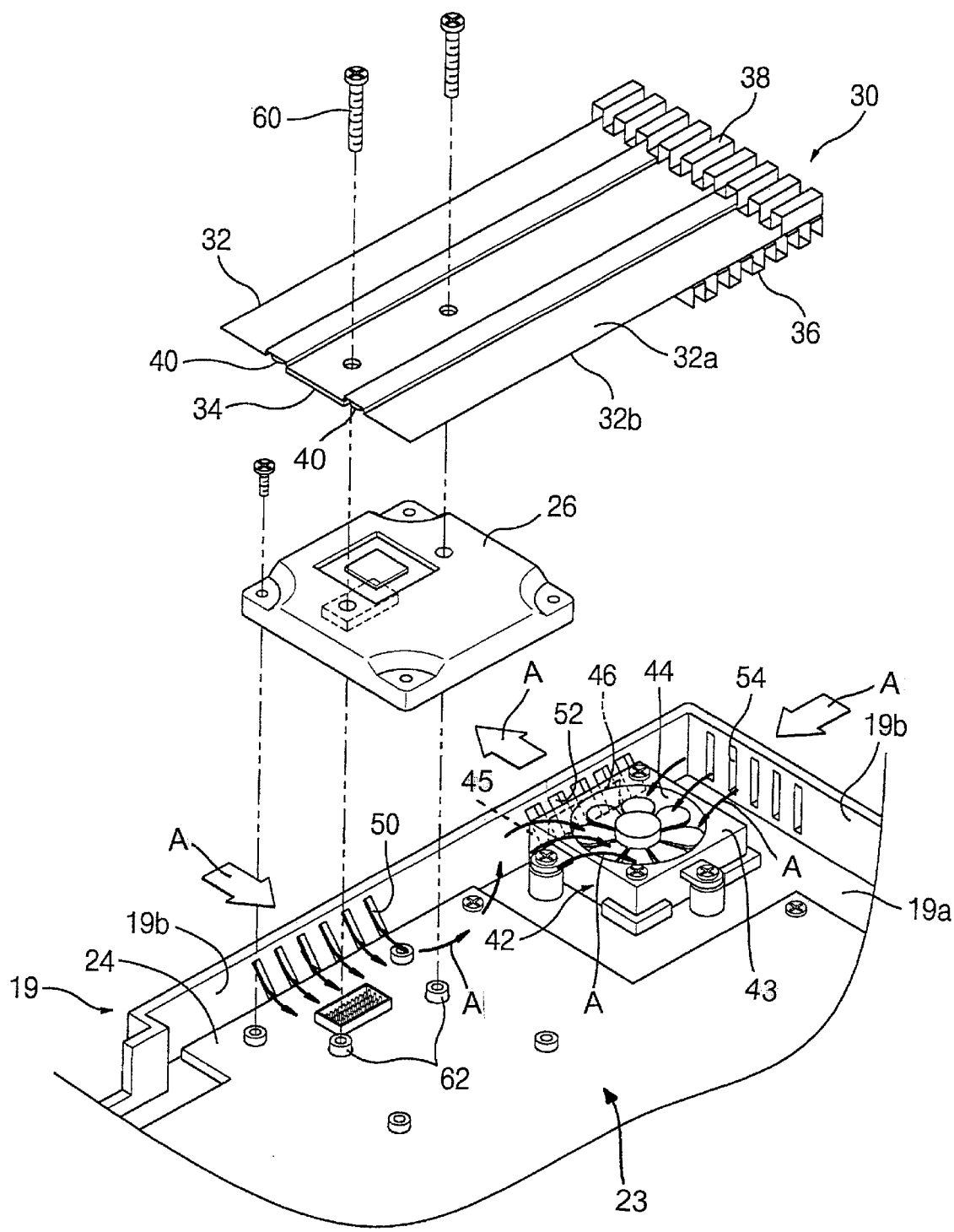
FIG. 3 is a partially enlarged view showing the mounting a fan of the radiation apparatus shown in FIG. 1 in a housing of a portable computer according to the present invention.

FIGS. 2A and 2B illustrate a radiation member 30 of a radiation apparatus shown in FIG. 1. Further, FIG. 3 is a partially enlarged view showing a state of mounting a fan 42 of a radiation apparatus shown in FIG. 1 in the interior 23 of housing or main body 12. Referring now to FIGS. 1 through 3, the radiation apparatus for the integrated circuit semiconductor device, such as central processing unit (CPU) 26, in portable computer 10 according to the present invention includes fan 42 and radiation member 30, for radiating heat radiated from a central processing unit (CPU) 26. The radiation member 30 is positioned in opposing relation to and coupled through a heat block 34 to the central processing unit (CPU) 26 mounted upon the mother board 24. Accordingly, the heat radiated from the central processing unit (CPU) 26, is transferred to the radiation member 30 and then is radiated to air in the interior 23 of the housing or main body 12. The radiation member 30 includes a radiation plate 32, a heat block 34, and an assembly with first radiation fins 36. For example, the radiation member 30 can further include second radiation fins 38 and a heat pipe 40 or a plurality of heat pipes 40 for improving a radiation effect.

Figure 5:
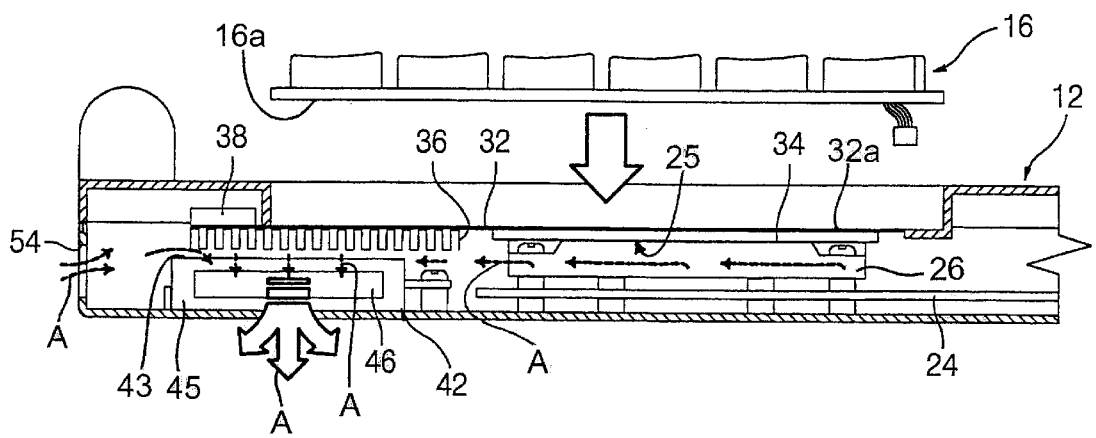
FIG. 5 is a partial cross-sectional view showing the completion state of mounting a radiation apparatus of FIGS. 1 through 3 in a portable computer according to an embodiment of the present invention.
Figure 6:
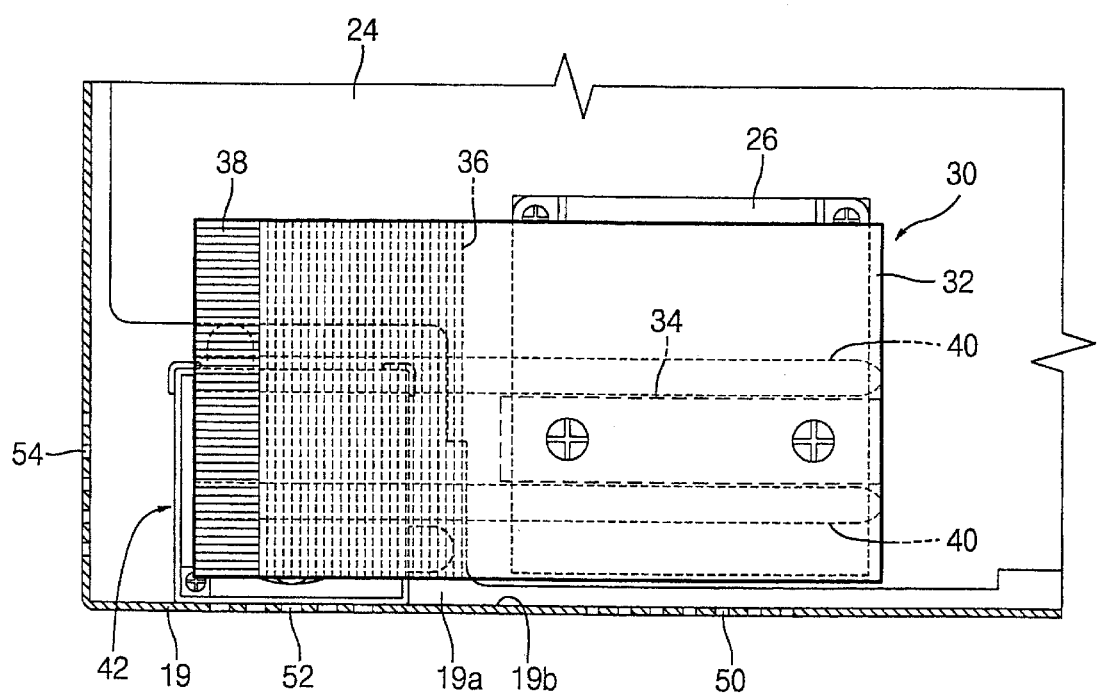
FIG. 6 is a partial top plan view showing the completion state of mounting a radiation apparatus FIGS. 1 through 3 in a portable computer according to an embodiment of the present invention.
Figure 7:
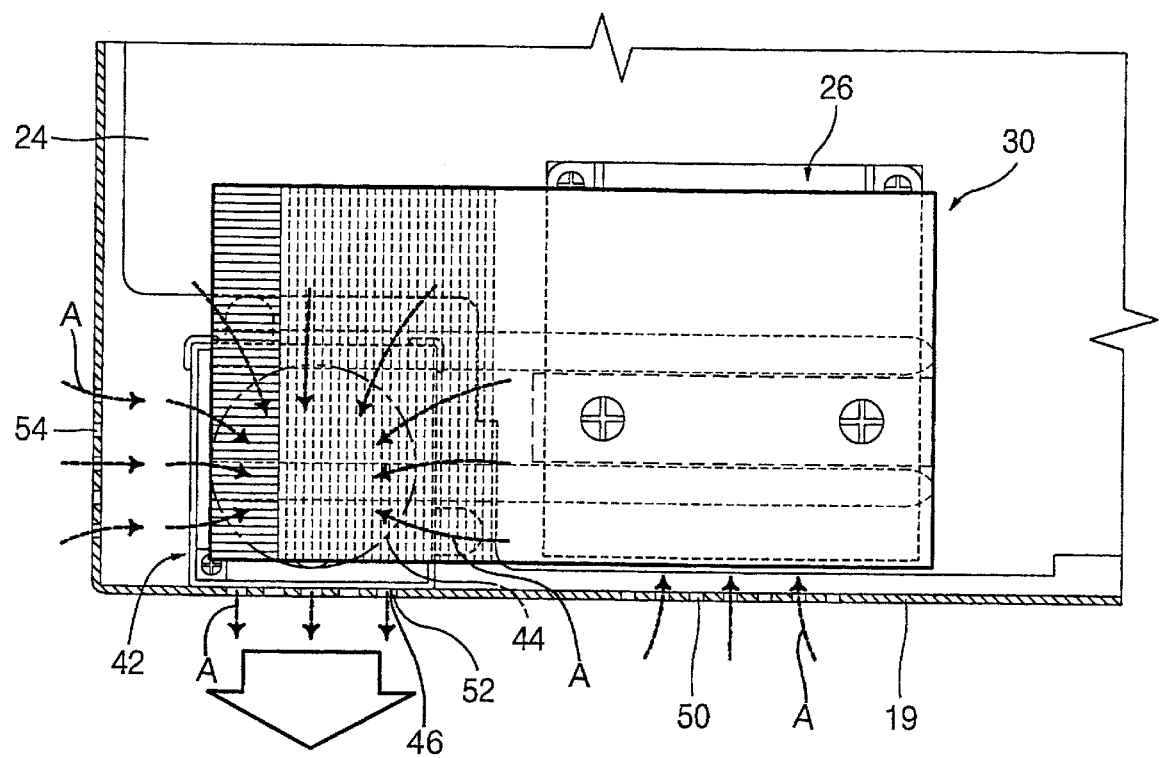
FIG. 7 is a partial top plan view for depicting a radiation effect of the radiation apparatus of FIGS. 1 through 3 in a portable computer according to an embodiment of the present invention.

Continuing with reference to FIGS. 1 through 3, as well as to FIGS. 5 and 6, radiation member 30 has a configuration in an embodiment of the present invention as follows. The radiation plate 32 of radiation member 30 is a plat type, with the central processing unit (CPU) 26 located under one end part of the radiation plate 32, and with the fan 42 being located under the other end part of the radiation plate 32 (referring to FIG. 5 and FIG. 6). A upper plane or first surface 32a of the radiation plate 32 is contacted with a plate 16a of the keyboard assembly 16 through the opening or aperture 22 of the receiving part 20. That is, a part of heat transferred to the radiation plate 32 is transferred to the plate 16a of the keyboard assembly 16 and then is radiated to the outside (referring to FIG. 5). The heat block 34 of radiation member 30 is coupled to one end part of lower or bottom plane or second surface 32b of the radiation plate 32 in opposing relation to the central processing unit (CPU) 26. The heat block 34 is contacted with an upper plane or first surface 25 of the central processing unit (CPU) 26. This allows the heat to be effectively transferred to the radiation plate 32. The first radiation fins 36 are coupled to the lower or bottom plane or second surface 32b of the other end part of the radiation plate 32, and second radiation fins 38 are coupled to the upper plane or first surface 32a of the other end part of the radiation plate 32. The first radiation fins 36 and the second radiation fins 38 can be coupled to the radiation plate 32 by a soldering method or a brazing method, for example. It is preferable that the first radiation fins 36 and the second radiation fins 38 are made of a shape and size taking into consideration the interior 23 of housing or main body 12, so as to increase effectiveness of heat radiation in a larger area.

Continuing with referring to FIGS. 1 through 3, 5 and 6, each heat pipe 40 is coupled to the lower or bottom plane or second surface 32b of the radiation plate 32 so that two of the heat pipes 40 are located so that one heat pipe 40 is to one side and the other heat pipe 40 is to the other side of both sides of the heat block 34, respectively. Each heat pipe 40 allows heat transferred from the central processing unit (CPU) 26 to the radiation plate 32 to be transferred more quickly to a part of the radiation plate 32 upon which the first radiation fins 36 and the second radiation fins 38 are mounted. In this regard, a large amount of heat transferred to the radiation plate 32 is radiated to internal air in the interior 23 of housing or main body 12 through the first radiation fins 36 and the second radiation fins 38.

The first radiation fins 36 and the second radiation fins 38 are intensively mounted upon the other end part of the radiation plate 32 in opposing relation to the fan 42. This allows heat radiated from the first radiation fins 36 and the second radiation fins 38 to be directly radiated to the outside of housing or main body 12, along a current of air by driving of the fan 42. By use of the fan 42 and the radiation member 30, the radiation effectiveness of the radiation apparatus according to the present invention can be maximized.

Continuing with referring again to FIGS. 1 through 3, 5 and 6, the upper plane or first surface 43 of the fan 42 is positioned to be in parallel relation to the lower or bottom plane or first surface 19a of the bottom housing 19 so that the fan 42 is located under one end part of the radiation member 30. The fan 42 is mounted so that a rotation axis of the fan 42 is vertical to lower or bottom plane or first surface 19a. It is preferable that the fan 42 is arranged in a row relation, positioned across from the central processing unit (CPU) 26. An air inlet 44, where internal air from the interior 23 of housing or main body 12 is introduced, is made on the upper plane or first surface 43 of the fan 42 and an air outlet 46 of fan 42, where the introduced air is exhausted, is made on one lateral plane or second surface 45 of fan 42. Internal air exhausted through the outlet 46 is directly exhausted to the outside of housing or main body 12 through a second air vent 52. In this regard, the mounted position of the fan 42 in the interior 23 of housing or main body 12 is very important. That is, as shown in FIG. 3 and FIG. 6, it is preferable that the fan 42 is mounted so that the one lateral plane or second surface 45 of the fan 42 wherein the outlet 46 is located is very closely located to one lateral plane or one third surface 19b of the bottom housing 19 where the second air vent 52 is located. The fan 42 can maximally radiate air (heat) in housing or main body 12 to the outside of the housing or main body 12. Since the fan 42 is positioned on a bottom plane or first surface 19a of bottom housing 19 of housing or main body 12, a portable computer 10 having a limited interior can effectively become slim.

Continuing with reference to FIGS. 1 through 6, particularly FIGS. 1 through 3, a first air vent 50, a second air vent 52, a third air vent 54, as well as a plurality of other air vents (not shown) can be respectively made on the lateral planes or third surfaces 19b of the bottom housing 19 of housing or main body 12. The first air vent 50 is made on a lateral plane or a third surface 19b of the bottom housing 19 so as to be located close to the central processing unit (CPU) 26. The second air vent 52 is made on a lateral plane or a third surface 19b of the bottom housing 19 so as to be located close to the fan 42. The third air vent 54 is made on another lateral plane or another third surface 19b of the bottom housing 19 so as to be located close to fan 42 and positioned in proximity to the second air vent 52.

It is preferable that parts constituting a radiation member 30 of the present invention be made of aluminum or an aluminum alloy having excellent thermal transmittance. Although it is shown in FIGS. 1 through 6 that a part coupled to the radiation member 30 is the central processing unit (CPU) 26 in an embodiment of the present invention, the central processing unit (CPU) 26 can be replaced with another integrated circuit semiconductor device at which heat is generated.

A structural feature of the invention is that a housing or main body 12 of portable computer 10 can effectively become slim because fan 42 is laid on a lower or bottom plane or first surface 19a of a housing or main body 12, an air inlet 46 is mounted on an upper plane or first surface 43 of the fan 42, and an air outlet 44 is mounted on one lateral plane or second surface 45 of fan 42. Another structural feature of the present invention is that an integrated circuit semiconductor device, such as central processing unit (CPU) 26, and a radiation member 30 can be easily mounted and separated through an opening or aperture 22 made in a receiving part 20 of the housing or main body 12 of portable computer 10.

Referring now to FIGS. 1 through 6, and particularly to FIGS. 4A through 4D, FIGS. 4A through 4D sequentially illustrate the steps of mounting a radiation apparatus, such as radiation member 30 and fan 42, for an integrated circuit semiconductor device, such as central processing unit (CPU) 26, in a portable computer, such as portable computer 10, according to an embodiment of the present invention.

Figure 4A:
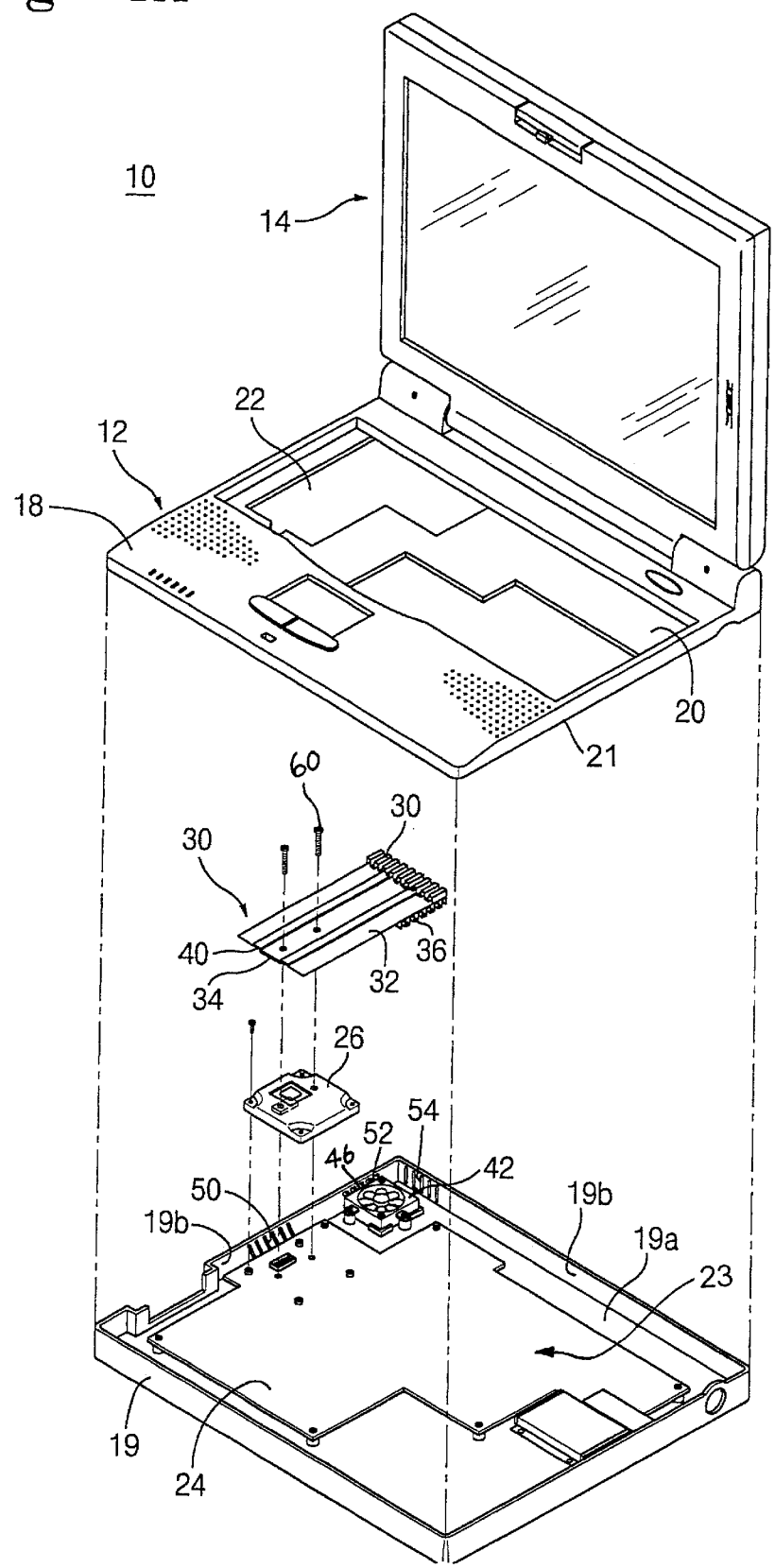
FIGS. 4A through 4D are diagrams for depicting the steps of mounting a radiation apparatus of FIGS. 1 through 3 for an integrated circuit semiconductor device in a portable computer according to an embodiment of the present invention.
Figure 4B:
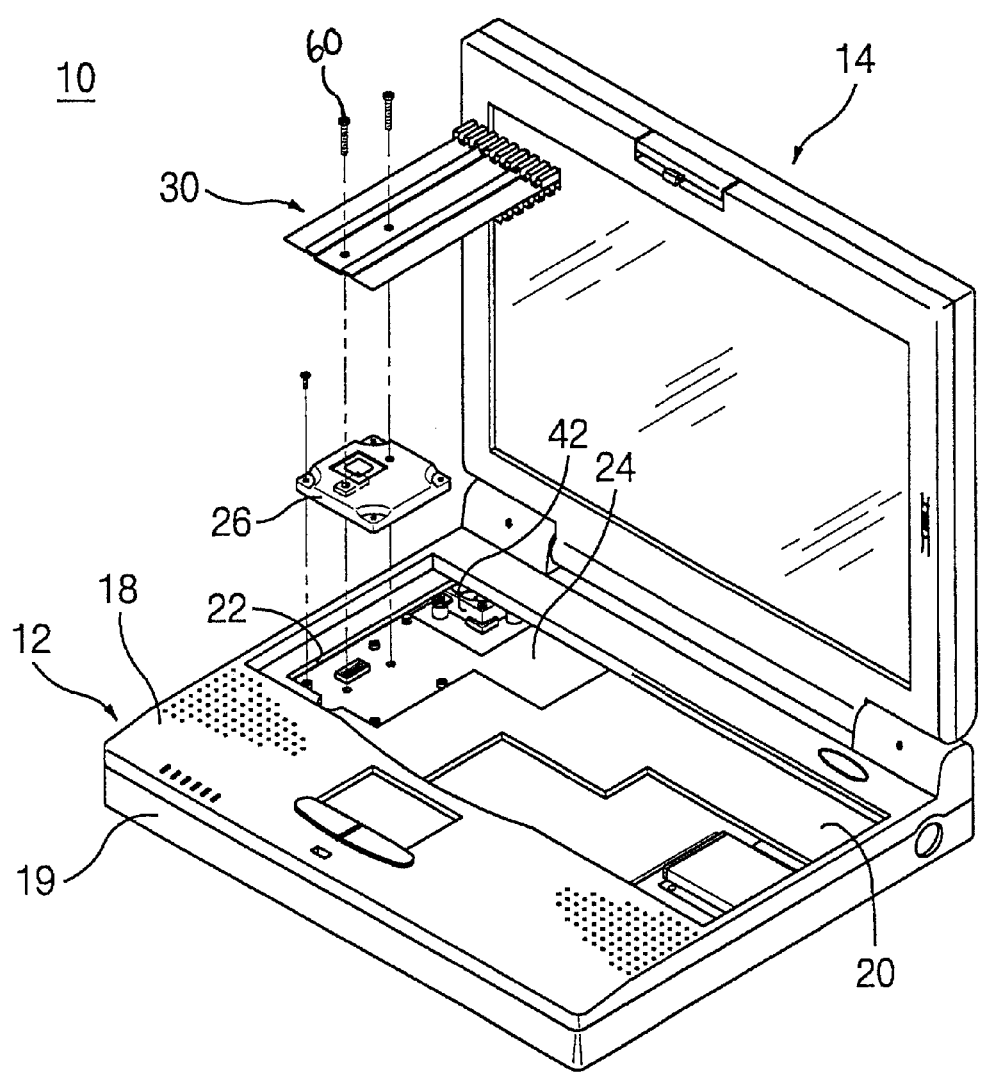

As shown in FIG. 4A, the mother board 24 is mounted upon a lower or bottom plane or first surface 19a of a bottom housing 19 of housing or main body 12. The fan 42 is also positioned on the lower or bottom plane or first surface 19a of bottom housing 19. At this time, outlet 46 of fan 42 (shown in also FIG. 3) is preferably made to be closely located to one lateral plane or third surface 19b of the bottom housing 19 where second air vent 52 is located. The top housing 18 is coupled to the bottom housing 19 (referring to FIGS. 4A and 4B) to provide the upper plane or second surface 21 of housing or main body 12.

Figure 4C:
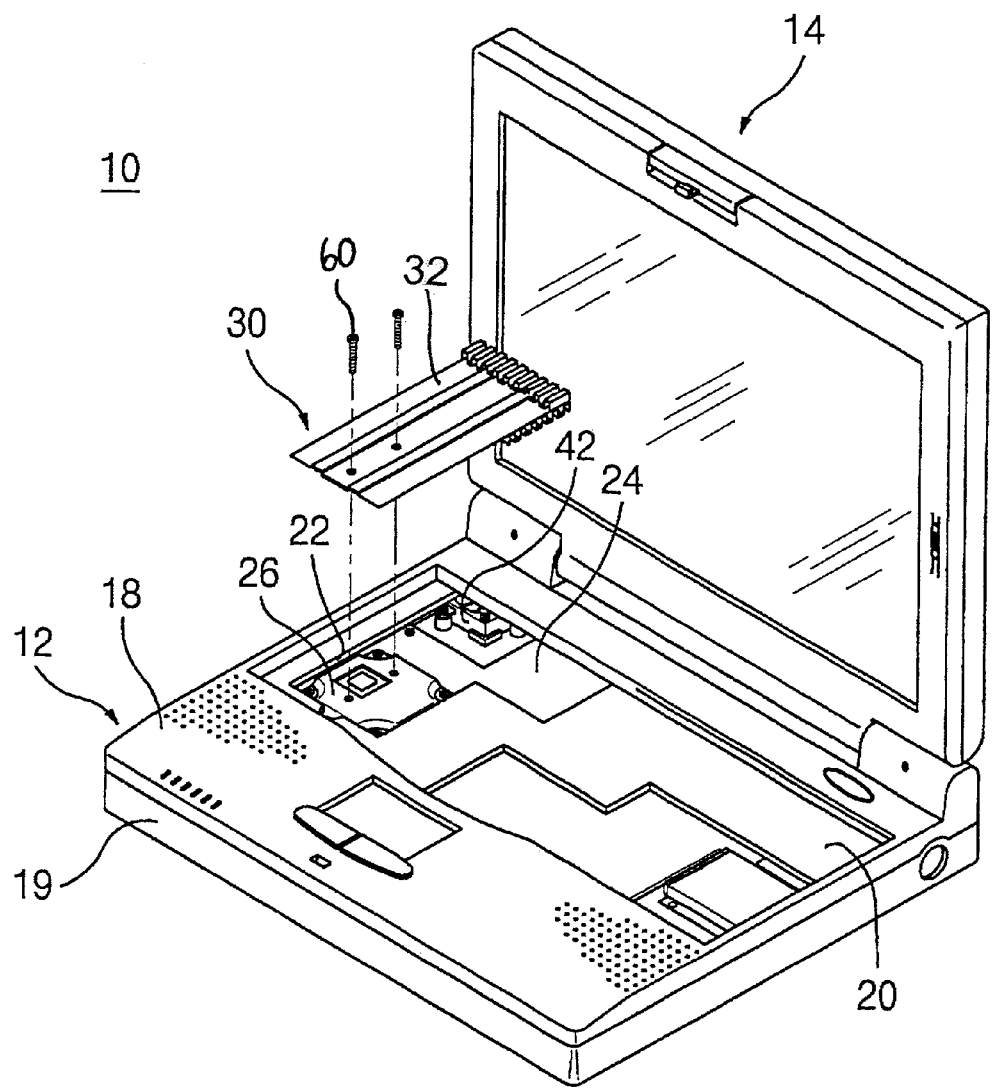
Figure 4D:
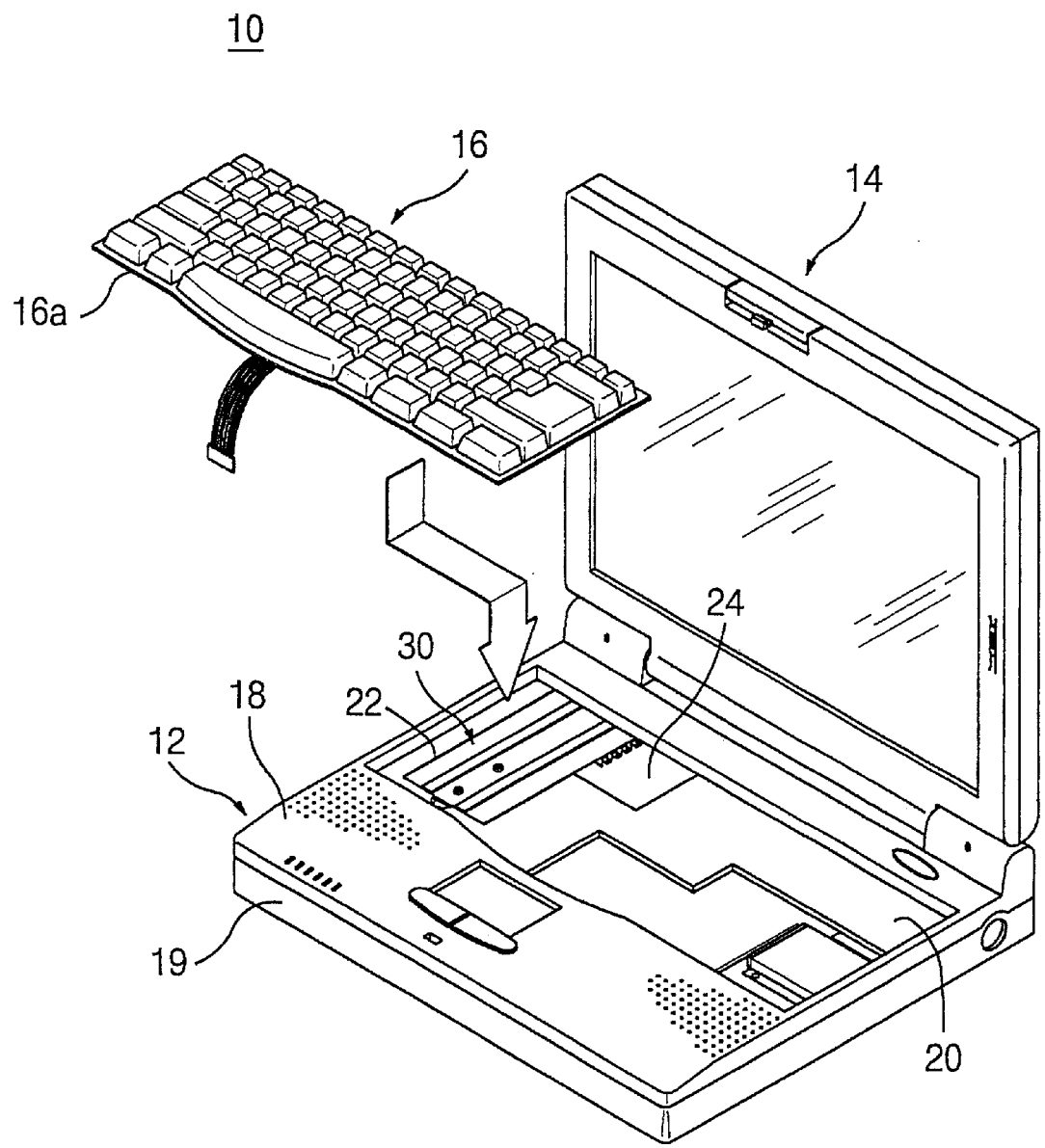

Continuing, the central processing unit (CPU) 26 is mounted upon the mother board 24 through the opening or aperture 22 made in the receiving part 20 of the top housing 18 (referring to FIG. 4C). The central processing unit (CPU) 26 can be easily mounted and separated through the opening or aperture 22. Finally, referring to FIGS. 3, 4C, 4D and 5, the radiation member 30 is coupled to the central processing unit (CPU) 26 through the opening or aperture 22 of the receiving part 20. At this time, the radiation member 30 is coupled to the central processing unit (CPU) 26 by screws 60 that penetrate the radiation plate 32, the heat block 34, and the central processing unit (CPU) 26 and then is coupled to a boss 62 (shown in FIG. 1) protruded from the lower or bottom plane or first surface 19a of the bottom housing 19. The upper plane or first surface 32a of the radiation plate 32 is located in opposing relation to the opening or aperture 22 and then is contacted with the plate 16a of the keyboard assembly 16 when the keyboard assembly 16 is mounted in the receiving part 20. One end part of the radiation plate 32 in which the first radiation fins 36 and the second radiation fins 38 are mounted is located in opposing relation to the fan 42.

Continuing with reference to FIGS. 3 and 5 through 7, a heat radiation process in a portable computer 10 of this invention is described as follows. Referring to FIGS. 3 and 5 through 7, when the portable computer 10 is operated, the central processing unit (CPU) 26 is driven to generate heat. The fan 42 is also driven at the same time. The heat generated at the central processing unit (CPU) 26 is transferred to the radiation plate 32 through the heat block 34, as shown in FIG. 5. The heat transferred to the radiation plate 32 is dispersed to a heat pipe or heat pipes 40, the first radiation fins 36 and the second radiation fins 38, and the plate 16a of the keyboard assembly 16 and then is emitted. A large amount of heat transferred to the radiation plate 32 is transferred to the first radiation fins 36 and the second radiation fins 38 through the heat pipe or heat pipes 40 and then is emitted at the first radiation fins 36 and the second radiation fins 38. Arrows A shown in FIG. 3, FIG. 5, and FIG. 7 denote currents of air and respective directions or paths of air flow. Referring to the arrows A, when fan 42 is driven, air is introduced from the outside of housing or main body 12 through the first air vent 50 and the third air vent 54. Passing in contact with the central processing unit (CPU) 26 and the radiation member 30, the air is introduced to the inlet 44 of fan 42 along with heat emitted from the central processing unit (CPU) 26 and the radiation member 30. The first radiation fins 36 and second radiation fins 38 are intensively mounted at the other end part of the radiation plate 32 in opposing relation to the fan 42, thereby directly radiating a large amount of heat emitted from the first radiation fins 36 and the second radiation fins 38 to the air to be introduced to inlet 44 of fan 42 to be exhausted through outlet 46 of fan 42 through second air vent 52 to the outside of housing or main body 12 along a current of air (referring to arrows shown in FIG. 3, FIG. 5, and FIG. 7) by driving the fan 42.

Therefore, according to the present invention, it is possible to effectively radiate heat generated in an integrated circuit semiconductor device mounted upon a circuit board of an electronic system by using heat convection and conduction. Since a portable computer with the radiation apparatus of the present invention can effectively radiate heat, a radiation apparatus including a radiation member of a plate type and including a fan is positioned on a lower or bottom plane or first surface of a housing of a portable computer so that a portable computer having a limited interior can become slim. Further, according to the present invention, a radiation member including an assembly can be advantageously directly mounted upon an integrated circuit semiconductor device through an opening of a top housing without separating a housing of the portable computer.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the scope thereof. Therefore, it is intended that the present invention not be limited to the particular embodiments disclosed as the best mode contemplated for carrying out the present invention, but that the present invention includes all embodiments falling within the scope of the appended claims.

What is claimed is:

1. A radiation apparatus for an integrated circuit semiconductor device of an electronic system, comprising:

a radiation member for transferring and radiating heat generated by said integrated circuit semiconductor device, said radiation member being positioned in opposing relation to said integrated circuit semiconductor device; and a fan for exhausting heat, transferred from said integrated circuit semiconductor device through said radiation member, said fan being positioned in parallel spaced relation to said integrated circuit semiconductor device, said radiation member including a radiation plate, a heat block and an assembly of first radiation fins, and said radiation plate including an upper plane and a bottom plane and one end part of said radiation plate being located in opposing relation to said fan, and said heat block being in contact with an upper plane of said integrated circuit semiconductor device and being coupled to said bottom plane of said radiation plate, for transmitting heat transferred from said integrated circuit semiconductor device into said radiation plate, and said assembly of first radiation fins being located in opposing relation to said fan and being coupled to said radiation plate, said assembly of first radiation fins for radiating heat transferred from said integrated circuit semiconductor device.

2. The radiation apparatus of claim 1, further comprised of said fan including an air inlet on an upper plane of said fan and said fan including an air outlet on one lateral plane of said fan to exhaust air introduced from said air inlet of said fan, whereby air in an interior of said electronic system is exhausted out to an exterior of said electronic system via an air flow path including said air inlet on said upper plane of said fan and said air outlet on said one lateral plane of said fan.

3. The radiation apparatus of claim 2, further comprised of said radiation member further comprising:

an assembly of second radiation fins for radiating heat transferred from said integrated circuit semiconductor device and being coupled to said upper plane of said radiation plate located at said one end part of said radiation plate, said assembly of first radiation fins being coupled to said bottom plane of said radiation plate located at said one end part of said radiation plate; and a heat pipe coupled to said radiation plate for transmitting heat transferred from said integrated circuit semiconductor device to said one end part of said radiation plate, said heat pipe being coupled to said bottom plane of said radiation plate and being located to a side of said heat block.

4. The radiation apparatus of claim 3, further comprised of:

a plurality of heat pipes coupled to said radiation plate for transmitting heat transferred from said integrated circuit semiconductor device to said one end part of said radiation plate, said plurality of heat pipes being coupled to said bottom plane of said radiation plate and being respectively located to opposing sides of said heat block.

5. The radiation apparatus of claim 1, further comprised of said radiation member further comprising:

an assembly of second radiation fins for radiating heat transferred from said integrated circuit semiconductor device and being coupled to said upper plane of said radiation plate located at said one end part of said radiation plate, said assembly of first radiation fins being coupled to said bottom plane of said radiation plate located at said one end part of said radiation plate; and a heat pipe coupled to said radiation plate for transmitting heat transferred from said integrated circuit semiconductor device to said one end part of said radiation plate, said heat pipe being coupled to said bottom plane of said radiation plate and being located to a side of said heat block.

6. The radiation apparatus of claim 5, further comprised of:

a plurality of heat pipes coupled to said radiation plate for transmitting the heat transferred from said integrated circuit semiconductor device to said one end part of said radiation plate, said plurality of heat pipes being coupled to said bottom plane of said radiation plate and being respectively located to opposing sides of said heat block.

7. A portable computer, comprising:

a housing including a bottom plane, a top plane and plurality of lateral planes which define an interior of said housing;

a circuit board located on said bottom plane of said housing;

a receiving part on said top plane of said housing and defining an aperture passing into said interior of said housing;

a removable keyboard assembly including a plate and being positioned on said receiving part;

an integrated circuit semiconductor device located on said circuit board in opposing relation to said aperture of said receiving part;

a radiation member for transferring and radiating heat generated by said integrated circuit semiconductor device, said radiation member being positioned in opposing relation to and being in contact with said integrated circuit semiconductor device and being in contact with said plate of said removable keyboard assembly; and a fan for exhausting air from said interior of said housing to an exterior of said housing, said fan being located under said radiation member and being positioned on said bottom plane of said housing and being positioned adjacent to one of said plurality of lateral planes of said housing.

8. The portable computer of claim 7, further comprised of said radiation member comprising:

a radiation plate including an upper plane and a bottom plane, and one end part of said radiation plate being located in opposing relation to said fan, and said upper plane of said radiation plate being in contact with said plate of said removable keyboard assembly through said aperture of said receiving part;

a heat block being in contact with an upper plane of said integrated circuit semiconductor device and being coupled to said bottom plane of said radiation plate, for transmitting heat generated by said integrated circuit semiconductor device into said radiation plate;

an assembly of first radiation fins being coupled to said bottom plane of said radiation plate in opposing relation to said fan, said assembly of first radiation fins for radiating heat generated by said integrated circuit semiconductor device;

an assembly of second radiation fins being coupled to said upper plane of said radiation plate located at said one end part of said radiation plate, said assembly of second radiation fins for radiating heat generated by said integrating circuit semiconductor device, said assembly of first radiation fins being coupled to said bottom plane of said radiation plate located at said one end part of said radiation plate; and a heat pipe being coupled to said bottom plane of said radiation plate such that one end part of said heat pipe is in contact with said assembly of first radiation fins, said heat pipe for directly transmitting heat generated by said integrated circuit semiconductor device into said assembly of first radiation fins.

9. The portable computer of claim 8, further comprised of:

a plurality of heat pipes being coupled to said bottom plane of said radiation plate such that one end part of each of said plurality heat pipes is in contact with said assembly of first radiation fins, said plurality of heat pipes for directly transmitting heat generated by said integrated circuit semiconductor device into said assembly of first radiation fins.

10. The portable computer of claim 8, further comprising:

a first air vent located on a lateral plane of said plurality of lateral planes of said housing adjacent to said integrated circuit semiconductor device;

a second air vent located on a lateral plane of said plurality of lateral planes of said housing adjacent to said fan; and a third air vent located on another lateral plane of said plurality of lateral planes of said housing relative to said second air vent and said first air vent, whereby exterior air is introduced into said interior of said housing through said first air vent and said third air vent by driving of said fan and the introduced air is introduced into an inlet of said fan by passing in contact with said integrated circuit semiconductor device and said radiation member and thereby forming an air flow path to said exterior of said housing through an outlet of said fan and through said second air vent.

11. The portable computer of claim 10, further comprised of said first air vent and said second air vent being located on a same lateral plane of said plurality of lateral planes of said housing.

12. The portable computer of claim 11, further comprised of:

a plurality of heat pipes being coupled to said bottom plane of said radiation plate such that one end part of each of said plurality heat pipes is in contact with said of assembly first radiation fins, said plurality of heat pipes for directly transmitting heat generated by said integrated circuit semiconductor device into said assembly of first radiation fins.

13. The portable computer of claim 10, further comprised of:

a plurality of heat pipes being coupled to said bottom plane of said radiation plate such that one end part of each of said plurality heat pipes is in contact with said assembly of first radiation fins, said plurality of heat pipes for directly transmitting heat generated by said integrated circuit semiconductor device into said assembly of first radiation fins.

14. The portable computer of claim 7, further comprising:

a first air vent located on a lateral plane of said plurality of lateral planes of said housing adjacent to said integrated circuit semiconductor device;

a second air vent located on a lateral plane of said plurality of lateral planes of said housing adjacent to said fan; and a third air vent located on another lateral plane of said plurality of lateral planes of said housing relative to said second air vent and said first air vent, whereby exterior air is introduced into said interior of said housing through said first air vent and said third air vent by driving of said fan and the introduced air is introduced into an inlet of said fan by passing in contact with said integrated circuit semiconductor device and said radiation member and thereby forming an air flow path to said exterior of said housing through an outlet of said fan and through said second air vent.

15. The portable computer of claim 14, further comprised of said first air vent and said second air vent being located on a same lateral plane of said plurality of lateral planes of said housing.

16. A radiation apparatus for an integrated circuit semiconductor device of an electronic system, comprising:

a radiation member for transferring and radiating heat generated by said integrated circuit semiconductor device, said radiation member being positioned in opposing relation to said integrated circuit semiconductor device; and a fan for exhausting heat, transferred from said integrated circuit semiconductor device through said radiation member, said fan being positioned in parallel spaced relation to said integrated circuit semiconductor device, said radiation member including a radiation plate, a heat block and an assembly of first radiation fins, and said radiation plate including a first surface and a second surface and one end part of said radiation plate being located in opposing relation to said fan, and said heat block being in contact with a first surface of said integrated circuit semiconductor device and being coupled to said second surface of said radiation plate, for transmitting heat transferred from said integrated circuit semiconductor device into said radiation plate, and said assembly of first radiation fins being located in opposing relation to said fan and being coupled to said radiation plate, said assembly of first radiation fins for radiating heat transferred from said integrated circuit semiconductor device.

17. The radiation apparatus of claim 16, further comprised of said fan including an air inlet on a first surface of said fan and said fan including an air outlet on a second surface of said fan to exhaust air introduced from said air inlet of said fan, whereby air in an interior of said electronic system is exhausted out to an exterior of said electronic system via an air flow path including said air inlet on said first surface of said fan and said air outlet on said second surface of said fan.

18. The radiation apparatus of claim 17, further comprised of said radiation member further comprising:

an assembly of second radiation fins for radiating heat transferred from said integrated circuit semiconductor device and being coupled to said first surface of said radiation plate located at said one end part of said radiation plate, said assembly of first radiation fins being coupled to said second surface of said radiation plate located at said one end part of said radiation plate; and a heat pipe coupled to said radiation plate for transmitting the heat transferred from said integrated circuit semiconductor device to said one end part of said radiation plate, said heat pipe being coupled to said second surface of said radiation plate and being located to a side of said heat block.

19. The radiation apparatus of claim 18, further comprised of:

a plurality of heat pipes coupled to said radiation plate for transmitting the heat transferred from said integrated circuit semiconductor device to said one end part of said radiation plate, said plurality of heat pipes being coupled to said second surface of said radiation plate and being respectively located to opposing sides of said heat block.

20. The radiation apparatus of claim 16, further comprised of said radiation member further comprising:

an assembly of second radiation fins for radiating heat transferred from said integrated circuit semiconductor device and being coupled to said first surface of said radiation plate located at said one end part of said radiation plate, said assembly of first radiation fins being coupled to said second surface of said radiation plate located at said one end part of said radiation plate; and a heat pipe coupled to said radiation plate for transmitting the heat transferred from said integrated circuit semiconductor device to said one end part of said radiation plate, said heat pipe being coupled to said second surface of said radiation plate and being located to a side of said heat block.

21. The radiation apparatus of claim 20, further comprised of:

a plurality of heat pipes coupled to said radiation plate for transmitting the heat transferred from said integrated circuit semiconductor device to said one end part of said radiation plate, said plurality of heat pipes being coupled to said second surface of said radiation plate and being respectively located to opposing sides of said heat block.

22. A portable computer, comprising:

a housing including a first surface, a second surface and plurality of third surfaces which define an interior of said housing;

a circuit board located on said first surface of said housing;

a receiving part on said second surface of said housing and defining an aperture passing into said interior of said housing;

a removable keyboard assembly including a plate and being positioned on said receiving part;

an integrated circuit semiconductor device located on said circuit board in opposing relation to said aperture of said receiving part;

a radiation member for transferring and radiating heat generated by said integrated circuit semiconductor device, said radiation member being positioned in opposing relation to and being in contact with said integrated circuit semiconductor device and being in contact with said plate of said removable keyboard assembly; and a fan for exhausting air from said interior of said housing to an exterior of said housing, said fan being located under said radiation member and being positioned on said first surface of said housing and being positioned adjacent to one of said plurality of third surfaces of said housing.

23. The portable computer of claim 22, further comprised of said radiation member comprising:

a radiation plate including a first surface and a second surface, and one end part of said radiation plate being located in opposing relation to said fan, and said first surface of said radiation plate being in contact with said plate of said removable keyboard assembly through said aperture of said receiving part;

a heat block being in contact with a first surface of said integrated circuit semiconductor device and being coupled to said second surface of said radiation plate, for transmitting heat generated by said integrated circuit semiconductor device into said radiation plate;

an assembly of first radiation fins being coupled to said second surface of said radiation plate in opposing relation to said fan, said assembly of first radiation fins for radiating heat generated by said integrated circuit semiconductor device;

an assembly of second radiation fins being coupled to said first surface of said radiation plate located at said one end part of said radiation plate, said assembly of second radiation fins for radiating heat generated by said integrating circuit semiconductor device, said assembly of first radiation fins being coupled to said second surface of said radiation plate located at said one end part of said radiation plate; and a heat pipe being coupled to said second surface of said radiation plate such that one end part of said heat pipe is in contact with said assembly of first radiation fins, said heat pipe for directly transmitting heat generated by said integrated circuit semiconductor device into said assembly of first radiation fins.

24. The portable computer of claim 23, further comprised of:

a plurality of heat pipes being coupled to said second surface of said radiation plate such that one end part of each of said plurality heat pipes is in contact with said assembly of first radiation fins, said plurality of heat pipes for directly transmitting heat generated by said integrated circuit semiconductor device into said assembly of first radiation fins.

25. The portable computer of claim 23, further comprising:

a first air vent located on a third surface of said plurality of third surfaces of said housing adjacent to said integrated circuit semiconductor device;

a second air vent located on a third surface of said plurality of third surfaces of said housing adjacent to said fan; and a third air vent located on another third surface of said plurality of third surfaces of said housing relative to said second air vent and said first air vent, whereby exterior air is introduced into said interior of said housing through said first air vent and said third air vent by driving of said fan and the introduced air is introduced into an inlet of said fan by passing in contact with said integrated circuit semiconductor device and said radiation member and thereby forming an air flow path to said exterior of said housing through an outlet of said fan and through said second air vent.

26. The portable computer of claim 25, further comprised of said first air vent and said second air vent being located on a same third surface of said plurality of third surfaces of said housing.

27. The portable computer of claim 26, further comprised of:

a plurality of heat pipes being coupled to said second surface of said radiation plate such that one end part of each of said plurality heat pipes is in contact with said assembly of first radiation fins, said plurality of heat pipes for directly transmitting heat generated by said integrated circuit semiconductor device into said assembly of first radiation fins.

28. The portable computer of claim 25, further comprised of:

a plurality of heat pipes being coupled to said second surface of said radiation plate such that one end part of each of said plurality heat pipes is in contact with said assembly of first radiation fins, said plurality of heat pipes for directly transmitting heat generated by said integrated circuit semiconductor device into said assembly of first radiation fins.

29. The portable computer of claim 22, further comprising:

a first air vent located on a third surface of said plurality of third surfaces of said housing adjacent to said integrated circuit semiconductor device;

a second air vent located on a third surface of said plurality of third surfaces of said housing adjacent to said fan; and a third air vent located on another third surface of said plurality of third surfaces of said housing relative to said second air vent and said first air vent, whereby exterior air is introduced into said interior of said housing through said first air vent and said third air vent by driving of said fan and the introduced air is introduced into an inlet of said fan by passing in contact with said integrated circuit semiconductor device and said radiation member and thereby forming an air flow path to said exterior of said housing through an outlet of said fan and through said second air vent.

30. The portable computer of claim 29, further comprised of said first air vent and said second air vent being located on a same third surface of said plurality of third surfaces of said housing.

31. A heat radiation method for an integrated circuit semiconductor device of an electronic system, comprising the steps of:

providing a radiation member for transferring and radiating heat generated by said integrated circuit semiconductor device, said radiation member being positioned in opposing relation to said integrated circuit semiconductor device, said radiation member including a radiation plate, a heat block and an assembly of first radiation fins and said radiation plate including a first surface and a second surface;

providing a fan for exhausting heat, transferred from said integrated circuit semiconductor device through said radiation member, said fan being positioned in parallel spaced relation to said integrated circuit semiconductor device;

locating one end part of said radiation plate in opposing relation to said fan;

contacting said heat block with an upper surface of said integrated circuit semiconductor device and coupling said heat block to said second surface of said radiation plate;

locating at said one end part of said radiation plate said assembly of first radiation fins in opposing relation to said fan and coupling said assembly of first radiation fins to said second surface of radiation plate;

transmitting heat transferred from said integrated circuit semiconductor device into said radiation member; and radiating heat transferred into said radiation member from said integrated circuit semiconductor device by said assembly of first radiation fins.

32. The method of claim 31, further comprising the step of exhausting air in an interior of said electronic system out to an exterior of said electronic system via an air flow path including an air inlet on a first surface of said fan and an air outlet on a second surface of said fan.

33. The method of claim 31, further comprising the steps of:

providing an assembly of second radiation fins and coupling said assembly of second radiation fins to said first surface of said radiation plate located at said one end part of said radiation plate; and radiating heat transferred into said radiation member from said integrated circuit semiconductor device by said assembly of second radiation fins.

34. The method of claim 33, further comprising the step of exhausting air in an interior of said electronic system out to an exterior of said electronic system via an air flow path including an air inlet on a first surface of said fan and an air outlet on a second surface of said fan.

* * * * *